United States Patent
Travis et al.

(10) Patent No.: US 7,858,487 B2
(45) Date of Patent: Dec. 28, 2010

(54) METHOD AND APPARATUS FOR INDICATING DIRECTIONALITY IN INTEGRATED CIRCUIT MANUFACTURING

(75) Inventors: Edward O. Travis, Austin, TX (US); Mehul D. Shroff, Austin, TX (US); Donald E. Smeltzer, Austin, TX (US); Traci L. Smith, Johnson City, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/614,890

(22) Filed: Nov. 9, 2009

(65) Prior Publication Data

US 2010/0112779 A1    May 6, 2010

Related U.S. Application Data

(62) Division of application No. 11/360,925, filed on Feb. 23, 2006, now Pat. No. 7,635,920.

(51) Int. Cl.
*H01L 21/76* (2006.01)

(52) U.S. Cl. .............................. 438/401; 257/E21.525

(58) Field of Classification Search ................ 438/302, 438/401, 462, 975; 257/E21.525, E23.179
See application file for complete search history.

(56) References Cited

U.S. PATENT DOCUMENTS

| | | | |
|---|---|---|---|
| 4,973,217 A | 11/1990 | Engelbrecht | |
| 5,686,345 A | 11/1997 | Harmon et al. | |
| 5,742,041 A | 4/1998 | Liu | |
| 6,190,980 B1 | 2/2001 | Yu et al. | |
| 6,194,278 B1 | 2/2001 | Rengarajan | |
| 6,458,665 B1 | 10/2002 | Kim | |
| 6,742,708 B2 | 6/2004 | Shaked et al. | |
| 6,833,307 B1 | 12/2004 | Wristers et al. | |
| 6,842,538 B2 | 1/2005 | Lee et al. | |
| 6,911,660 B2 | 6/2005 | Larsen | |
| 7,138,318 B2 * | 11/2006 | Wu et al. ................... | 438/289 |

OTHER PUBLICATIONS

International Search Report and Written Opinion PCT/US07/60257, dated August 29, 2008.

* cited by examiner

*Primary Examiner*—Quoc D Hoang
(74) *Attorney, Agent, or Firm*—Kim-Marie Vo; Susan C. Hill

(57) ABSTRACT

An integrated circuit includes a visually discernable indicator formed as part of the integrated circuit to indicate a directionality of a non-visually discernable characteristic of the integrated circuit.

8 Claims, 7 Drawing Sheets

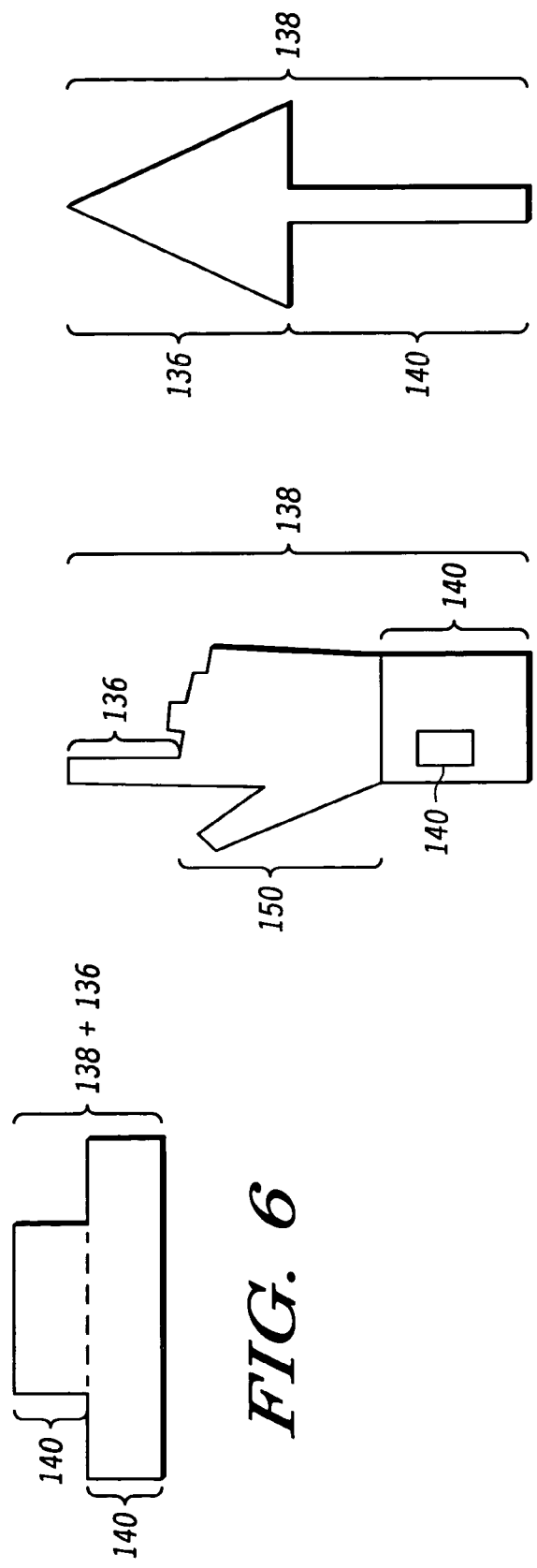

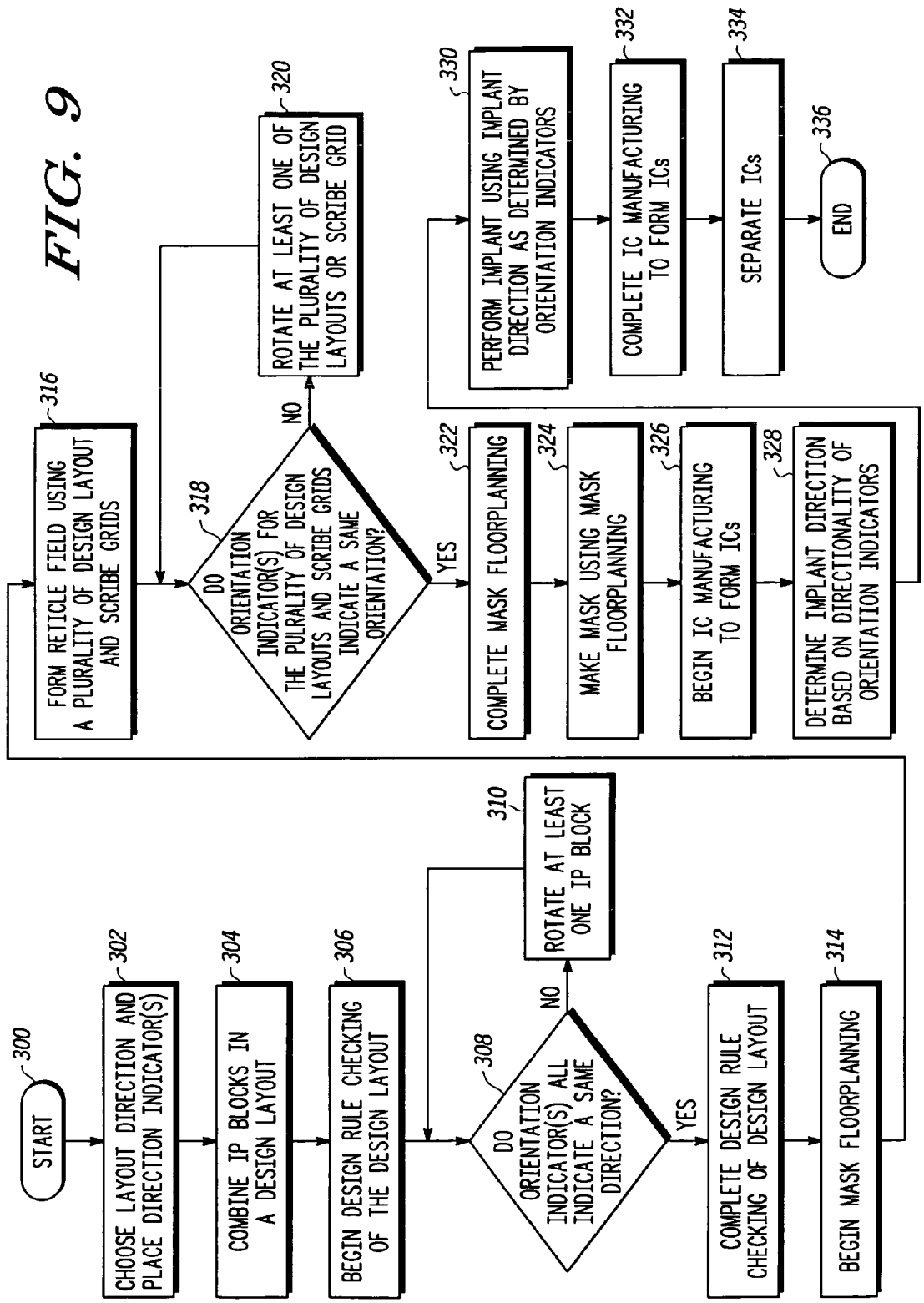

US 7,858,487 B2

METHOD AND APPARATUS FOR INDICATING DIRECTIONALITY IN INTEGRATED CIRCUIT MANUFACTURING

FIELD OF THE INVENTION

This invention relates generally to manufacturing integrated circuits, and more specifically, to methods and apparatuses that indicate directionality of an integrated circuit layout with respect to processes in integrated circuit manufacturing.

BACKGROUND

It is desirable to perform asymmetric halo implants to increase device performance. When there are various intellectual property (IP) blocks, such as SRAM components or a microprocessor core, verification of the correct orientation of the IP blocks may be needed so that the asymmetric halo implants, if present, will be performed in the correct direction or orientation on the correct location in each IP block. Typically, this verification occurs by checking each step in the design data flow between the data design and mask design. This is a slow and difficult process, which increases cycle time. In addition, there currently is no ability to verify the orientation in the manufacturing process.

Existing structures have appeared on masks and integrated circuits, such as alignment keys (which may be the shape of a Christmas tree or cactus) and critical dimension (CD) bars. But these existing structures are used for dimensional and overlay control.

Therefore, a need exists to verify orientation in the manufacturing process. In addition, it is desirable to improve cycle time when verifying correct orientation of IP blocks.

BRIEF DESCRIPTION OF THE DRAWINGS

The present invention is illustrated by way of example and is not limited by the accompanying figures, in which like references indicate similar elements.

FIGS. 6-8 illustrate indicators that can be used in different embodiments of the present invention; and FIG. 9 illustrates a flow chart using an indicator in integrated manufacturing in accordance with an embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Figure 1:
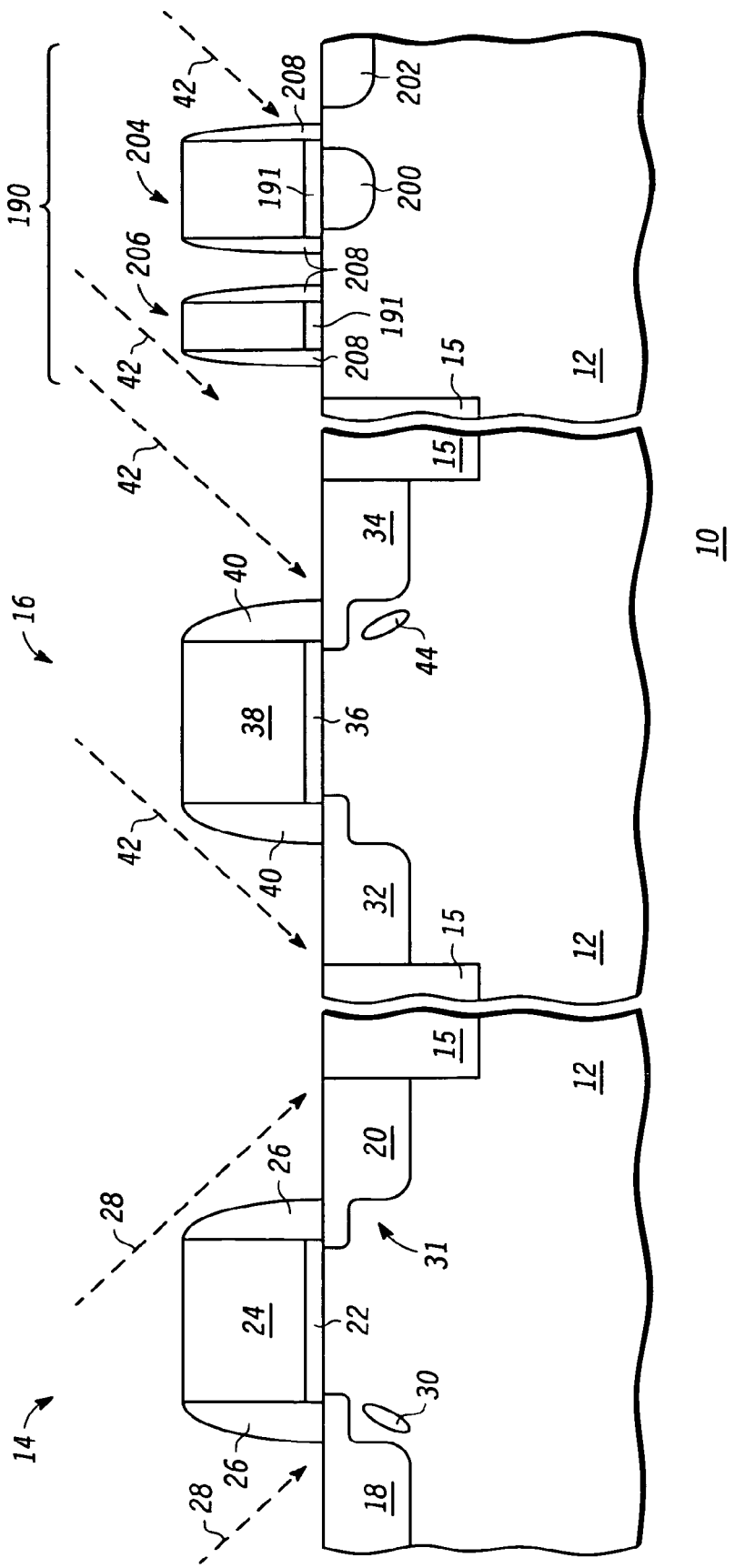
FIG. 1 illustrates a cross-sectional view of a portion of an integrated circuit showing asymmetrical halo implants and an indicator in accordance with an embodiment of the present invention.

FIG. 1 illustrates a cross-section of an integrated circuit 10 that includes an indicator 190 in accordance with one embodiment of the present invention. The integrated circuit 10 includes a device 14 with an implant direction A and a device 16 with an implant direction B and an indicator 190 all formed on a semiconductor substrate 12. In one embodiment, the implant direction A may have a first implant direction and implant direction B may have a second implant direction. The semiconductor substrate 12 can be any semiconductor material or combinations of materials, such as gallium arsenide, silicon germanium, silicon-on-insulator (SOI) (e.g., fully depleted SOI (FDSOI)), silicon, monocrystalline silicon, the like, and combinations of the above.

In one embodiment, the device 14 is an NMOS device and the device 16 is a PMOS device, or vice versa. In another embodiment, the devices 14 and 16 can be both NMOS or both PMOS, with different asymmetric implant directions. The device 14 includes a gate insulator 22, a gate electrode 24, spacers 26, a source region 18, and a drain region 20, which can be formed using conventional processing and materials. In a preferred embodiment, the gate insulator 22 includes silicon dioxide, a high dielectric constant (hi-k) dielectric, any insulating layer, or a combination of the above. The gate electrode may be any suitable material, such as polysilicon, metals, or combinations of the above. The spacers 26 may be any insulating material, such as silicon nitride.

In one embodiment, the source region 18 and the drain region 20 each include an extension region. A first halo implant region 30 or a pocket implant region 30 is formed near the source region 18 and not near the drain region 20. While it is desirable to have a halo implant region 30 near a source region to confine the source region, it is desirable to not have a halo implant region formed near the drain region to prevent electrons decelerating when traveling from the source to the drain region and hence, avoiding decreased device speed. The first halo implant region 30 is opposite in doping type to the source region 18 and is the same conductivity as the area of the semiconductor substrate 12 that underlies the gate insulator 22. In one embodiment, the device 14, the device 16, or both are asymmetrically doped devices. In an asymmetrically doped device, region 31 is a region adjacent the drain region 20 that has the same conductivity type as the halo implant region 30, but the halo implant region 30 has a higher dopant concentration than the region 31.

To form the first halo implant region 30 an asymmetric implant is performed, as shown by the arrows 28. The asymmetric implant is performed before forming source region 18 and drain region 20. The asymmetric implant occurs at an angle relative to an axis that is perpendicular to the wafer. In one embodiment, the angle is between approximately 20-50 degrees.

The device 16 with an implant direction B includes a gate insulator 36, a gate electrode 38, spacers 40, source region 34, and drain region 32, which can be formed using conventional processing and materials like the similar regions in the device 14. In one embodiment, the source region 34 and the drain region 32 each include an extension region. A second halo implant region 44 or a pocket implant region 44 is formed near the source region 34 and not near the drain region 32, like device 14. The difference between device 14 and device 16 is those two different asymmetric halo implants are performed to form the first halo implant region 30 and the second halo implant region 44. The different asymmetric halo implant regions have implant directions. The first halo implant shown by arrows 28 is in direction A (a first direction) and the second halo implant shown by arrows 42 are in direction B (a second direction). The second halo implant also occurs at an angle relative to an axis that is perpendicular to the wafer. In one embodiment, the angle is between approximately 20-50 degrees relative to a perpendicular to the wafer. The directions A and B, in one embodiment, have an angle of 90 degrees between them. In one embodiment, directions A and B are different from each other in that they are on different sides (i.e., right or left) of a transistor, as will be better understood after discussing FIG. 2.

Thus, in one embodiment, the integrated circuit 10 includes a first device that includes the source region 18, the drain region 20, and a first implant, such as the source halo implant regions 30. In addition, the integrated circuit 10 includes a second device that includes the source region 34, the drain region 32, and a second implant, such source halo implant region 44. A first implant direction may be used to form the first source halo implant, and a second implant direction, which is different from the first implant direction, may be used to form the second source halo implant.

In one embodiment, the indicator 190 is formed using a mask or multiple masks that include a first direction indicator, a function indicator, and a second direction indicator, as will be better understood after further discussion. In one embodiment, the first direction indicator and the function indicator are on an implant mask and hence implant regions 200 and 202 are formed during a tilt halo implant 42, as will be discussed, and the second direction indicator are formed on the gate electrode mask and, in one embodiment, are formed during the gate electrode process as elements 204 and 206. Hence, in this embodiment, the implant regions 200 and 202 have approximately the same thickness as elements 204 and 206. The dielectric layers 191 may be formed when forming the gate insulators 22 and 36. During subsequent processing when spacers are formed around gate electrodes (e.g., gate electrodes 24 and 38) spacers 208 are formed around elements 204 and 206.

Figure 2:
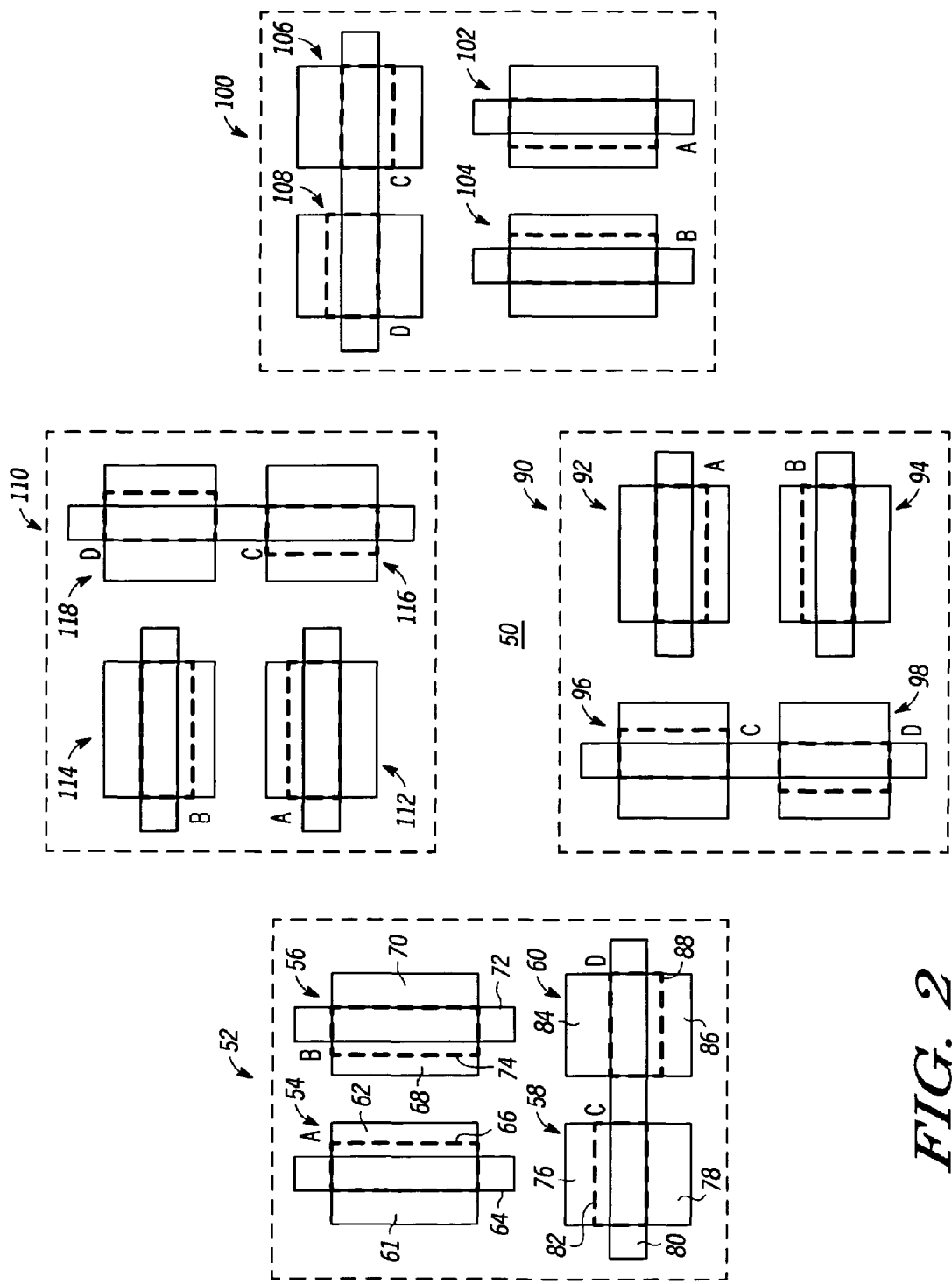
FIG. 2 illustrates a portion of a design layout without indicators.

FIG. 2 illustrates a design layout having IP blocks 52, 90, 100, and 110. Each IP block includes four devices with different directions. In one embodiment, the IP blocks only show the NMOS devices because they are all illustrated in one layer. In another embodiment, the IP blocks only show PMOS devices. IP block 52 includes device 54 with implant direction A, device 56 with implant direction B, device 58 with implant direction C, and device 60 with direction D. Directions A-D are all different.

The device 54 with implant direction A includes source region 62, drain region 61, and gate electrode 64. The dotted line 66 is a source marker. Of the two long edges of the source maker 66, one long edge is coincident with a portion of an edge of the gate electrode 64 and the other long edge extends into the source region 62. The source maker 66 allows for someone who understands and has access to the mask layout to know which side of the gate electrode 64 is the source region. Similarly, devices 92, 102, and 112 with implant direction A are include the same features as device 54 with implant direction A. However, in the embodiment illustrated the devices 54, 92, 102, and 112 are rotated relative to each other. The rotation relative to each other may occur when these device blocks are placed in different regions of the layout. In another embodiment, the devices 54, 92, 102, and 112 are not all rotated relative to each other. In this embodiment, four masks would be needed for the N devices and four masks for all the P devices for all of the IP blocks 52, 90, 100, and 110. In yet another embodiment, some of the devices 54, 92, 102, and 112 are rotated relative to each other while others are not.

The device 56 with implant direction B includes source region 68, drain region 70, gate electrode 72, and source maker 74, which are all similar to the same features of device 54. Similarly, devices 94, 104, and 114 with implant direction B include the same features as device 56 with implant direction B. However, as illustrated the devices 56, 94, 104, and 114 are rotated relative to each other.

The device 58 with implant direction C (a third direction) includes source region 76, drain region 78, gate electrode 80, and source maker 82, which are all similar to the same features of devices 54 and 56. Similarly, devices 96, 106, and 116 with implant direction C include the same features as device 58 with implant direction C. However, as illustrated the devices 58, 96, 106, and 116 are rotated relative to each other.

The device 60 with implant direction D (a fourth direction) includes source region 86, drain region 84, gate electrode 80, and source marker 88, which are all similar to the same features of devices 54, 56, and 58. Similarly, devices 98, 108, and 118 with implant direction D include the same features as device 60 with implant direction D. However, as illustrated the devices 60, 98, 108, and 118 are rotated relative to each other.

Devices 54 and 56 have different implant directions because the asymmetric halo implant formed by the implant direction will be formed in the source region, as discussed above in regards to FIG. 1, and the source regions of device 54 and 56 are on the opposite sides of the gate electrodes 64 and 72 respectively although the gate electrodes 64 and 72 run in the same direction. In other words, to form the halo regions for the devices 54 and 56 the angle implants will be in two different directions.

Device 58 has different implant direction than devices 54, 56 and 60 because the halo implant formed by the implant direction will be formed in the source region, as discussed above in regards to FIG. 1, and the source regions of device 54 and 56 are on the opposite sides of the gate electrodes 64 and 72 respectively although the gate electrodes 64 and 72 run in the same direction. In other words, to form the halo region for the device 54 an angle implant for device 54 will be in a different direction than the angle implant for device 56. Hence, two different angle implant processes will be used using two different masks. To form all the devices with the directions A-D four masks may be used.

Devices with different implant directions (i.e., implant directions A-D) have different implant directions because the source regions, which the halo regions will be formed underneath as discussed in FIG. 1, are not both parallel to and on the same side of the gate electrode as each other. For example, although the source regions are parallel to each other for device with implant direction A (e.g., device 54) and device with implant direction B (e.g., device 56) because the gate electrodes 64 and 72 are parallel to each other, the source region is not on the same side of the gate electrodes 64 and 72. Hence, two different angle implant processes for forming halo implant regions for devices 54 and 56 will be used using two different masks.

Similarly, devices with implant direction C (e.g., device 58) have parallel source regions with devices with implant direction D (e.g., device 60) because the same gate electrode 80 is used in both devices, the source regions are not on the same side of the gate electrode 80. Hence, two different angle implant processes for forming halo implant regions for devices 58 and 60 will be used using two different masks.

In addition, different implant masks must be used for all four devices in each IP block 52. The same mask cannot be used to form the halo implant for either device 54 or 56 and either device 58 and 60 because the gate electrodes for either device 54 or 56 is not parallel to the gate electrode for either device 58 or 60. Hence, a total of four different masks and implant process must be used to form the halo implant regions for devices 54, 56, 58, and 60. Similarly, for each IP block, different masks must be used.

Because in the embodiment illustrated in FIG. 2 IP block 52 is rotated 90 degrees to the right to form IP block 90, IP block 90 is then rotated 90 degrees to the right to form IP block 100, and IP block 100 is then rotated 90 degrees to the right to form IP block 110. In one embodiment, this might have been done to try to save real estate or space on a semiconductor wafer. Since the IP block 52 include identical devices, each identical device is labeled with the same implant direction. Thus, for example, devices 54, 92, 102, and 112 are all devices with implant direction A even though the devices 54, 92, 102, and 112 are rotated relative to each other.

As shown in the embodiment in FIG. 2, the IP blocks 52, 90, 100, and 110 are rotated relative to each other. In other embodiments (not shown), IP blocks may be flipped relative to each other. For example if the IP block 52 is flipped the device 54 may be to the left of the device 56 in one IP block and in the flipped IP block device 54 may be to the right of the device 56, etc. In the embodiment where IP blocks are flipped relative to each other the indicator used should detect flipping, but when the IP blocks are rotated relative to each the indicator should detect rotation. Thus, if IP blocks are both flipped and rotated an indicator that detects both rotation and flipping may be desirable.

From the layout data of FIG. 2, masks are created. Masks for each implant are some of the masks that are created. Since there are four different implant process for these NMOS devices four masks are needed. (Four additional implant process would be needed as well if the PMOS devices also have four different implant directions, making it a total of eight implant processes and mask. In one embodiment, design rules can be created to limit the direction of the gate electrode so that it must run vertical or horizontal, but not both. In this embodiment, the number of implant processes and masks is cut in half so that for both NMOS and PMOS devices only four implant processes and masks are needed.) One of the mask layouts is illustrated in FIG. 3.

Figure 3:
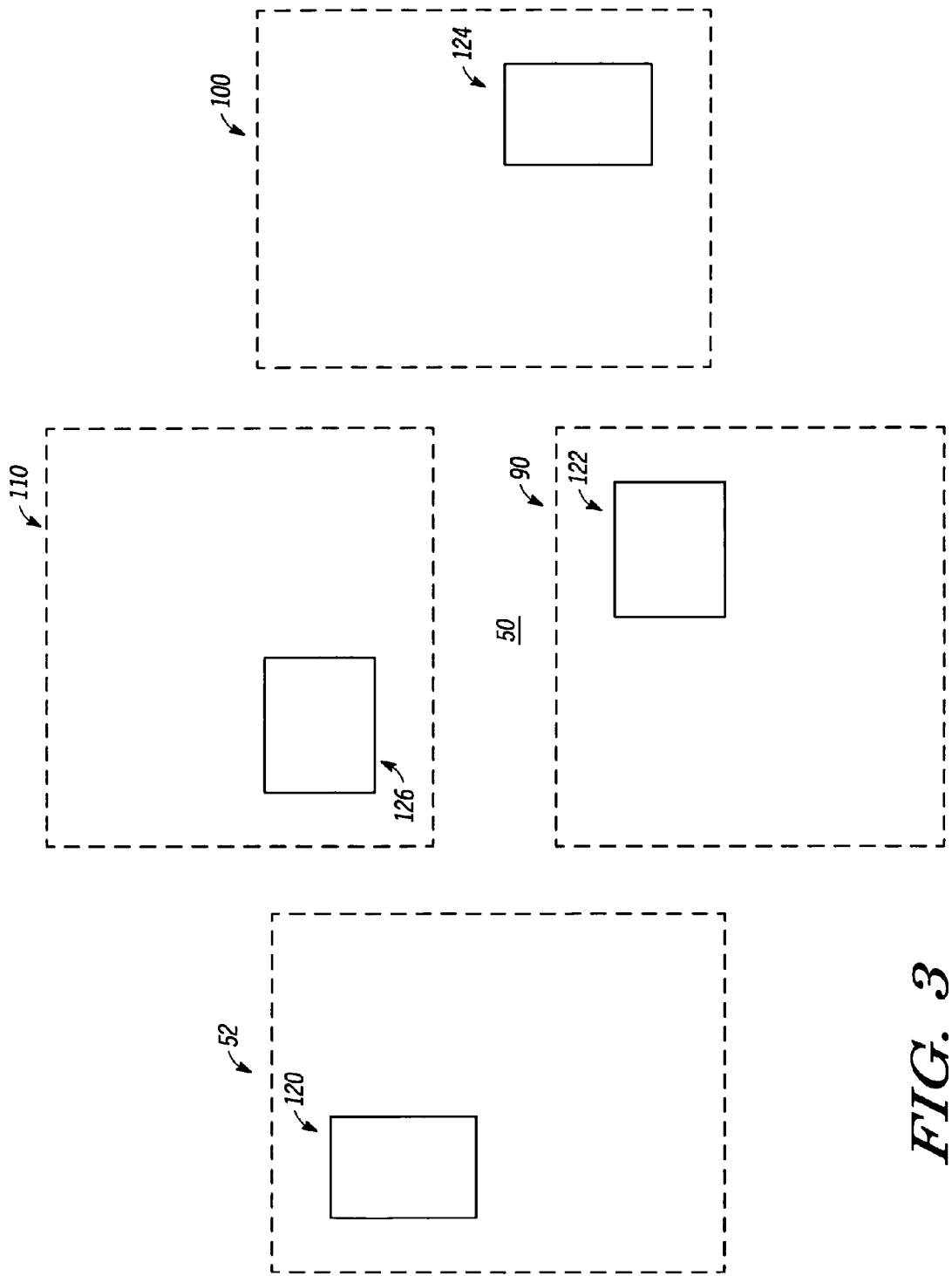
FIG. 3 illustrates a mask layout without indicators that can be used to form a portion of the mask data of FIG. 2 on a semiconductor.

The mask layout shown in FIG. 3 is the mask layout for the devices with direction A. The mask has openings 120, 122, 124, and 126 for devices 54, 92, 102, and 112, respectively. When looking at the mask layout shown in FIG. 3, there is no information to determine which direction the implant will be performed. In the layout data shown in FIG. 2, the source markers can be used to determine the where the implant direction. Therefore, a need exists for some way to check and monitor which direction is the implant direction for the mask in FIG. 3.

An indicator can be added to the mask of FIG. 3 so that the implant direction angle can be determined when by inspecting or looking at the mask. In one embodiment, the inspection or looking occurs visually with human eyes. In another embodiment, the inspection or looking occurs via a microscopy (optical or electron) based metrology tool or a computer. The indicator is not used to align two or more layers, which prior art photolithographic alignment symbols do. Instead, the indicator determines orientation or alignment within the same layer. In one embodiment, the indicator encodes orientation or direction. Any shape or symbol may be used provided it is asymmetric in a manner that allows detection of the orientation regardless of how the indicator is rotated or flipped. Thus, the indictor is not symmetric in all directions, but may be symmetric in at least one direction or asymmetric in all directions. In one embodiment, the indicator has asymmetry relative to directions A, B, C, or D.

Figure 4:
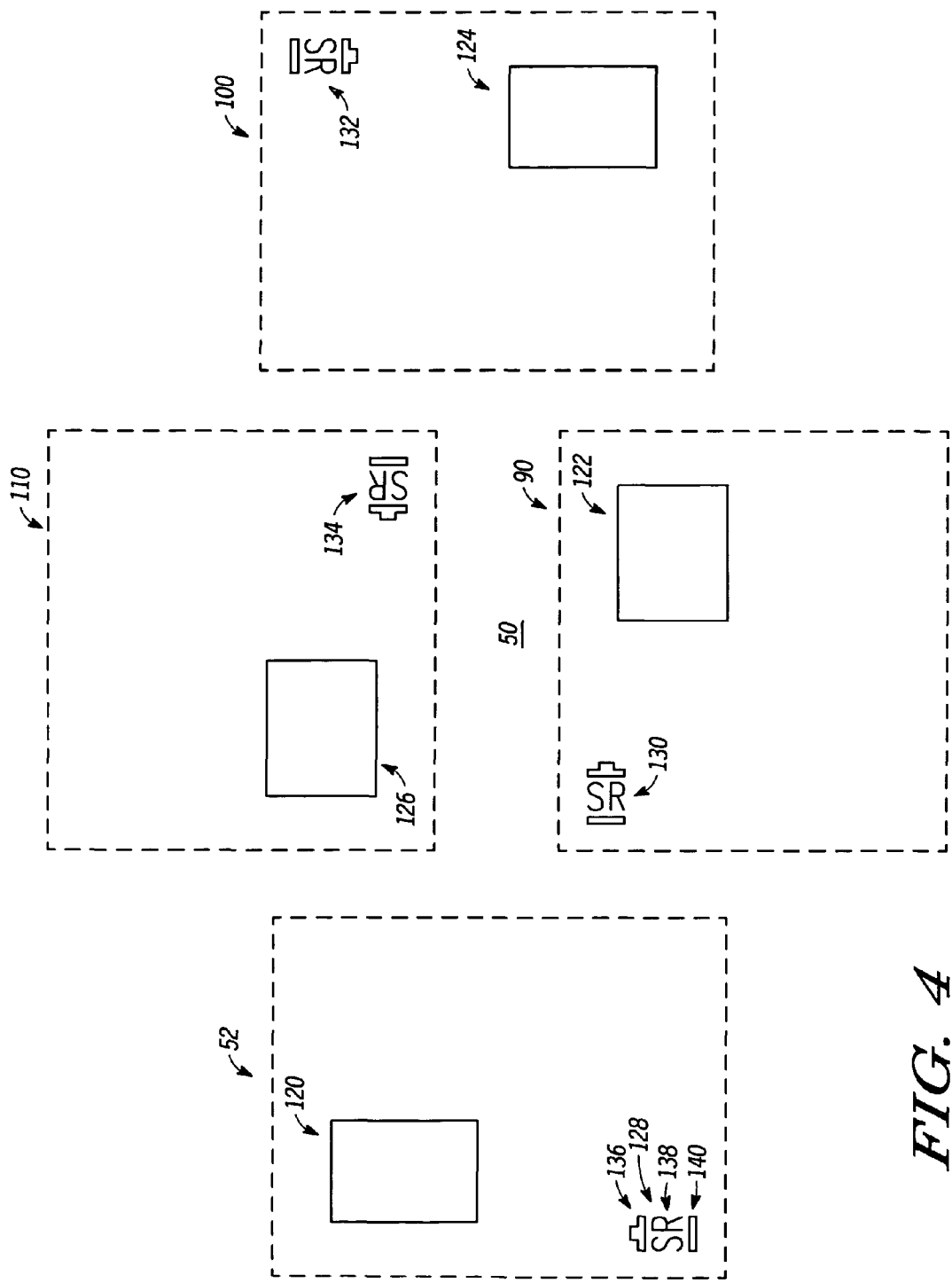
FIG. 4 illustrates the mask layout of FIG. 3 with indicators in accordance with an embodiment of the present invention showing an undesirable layout.

As shown in FIG. 4, an indicator is added. In one embodiment, the indicator 128 includes a first direction indictor 136, a function indicator 138, and a second direction indicator 140. The first direction indicator 136 in the embodiment illustrated in FIG. 4 is a hat shape, the function indicator 138 includes letters, such as "SR" for source, and the second direction indicator 140 includes a line that can be used for upsizing when checking the layout using a design rule checking deck to ascertain the indicator direction.

Although illustrated as a hat, the first direction indicator 136 can be any suitable shape. The first direction indicator 136 enables a person, such as an operator in manufacturing, to determine what direction an asymmetrical implant will occur. In the embodiment illustrated in FIG. 4, the top of the hat (i.e., the portion of the hat that is narrower than the opposite portion) points in the direction of the implant. Therefore, in FIG. 4, the indicator 136 points up, the indicator 130 points to the right, the indicator 132 points down, and the indicator 134 points to the left. Because each of the indicators 136, 130, 132, and 134 are pointing in different directions for the same asymmetrical implant process, it is easily determined that the blocks 52, 90, 100, and 110 are not aligned correctly. If they were aligned correctly, then the indicators 136, 130, 132, and 134 would all point in the same direction. Thus, three of the four blocks 52, 90, 100, and 110 must be rotated so that all of the first direction indicators 136 point in the same direction. In one embodiment, the first direction indicator 136 is located in the design layout, the implant mask, and is implanted on the wafer during an implant process. In one embodiment, the first direction indicator 136 is only on a mask (e.g., an implant mask).

In one embodiment (not illustrated), if the hat is used for the first direction indicator 136, it might be drawn as shown in FIG. 4 for direction A and that indicator for direction B might be identical except the hat might be upside down relative to the hat shown in FIG. 4. In other words, the top of the hat might be farthest away from the function indicator 138 for direction A and the top of the hat might be closest to the function indicator 138 for direction B, or vice versa.

The function indicator 138 is an indicator as to what is being indicated. In the embodiment illustrated in FIG. 4, "SR" is used to denote "source." In another embodiment, "SRC" could be used to denote source. However, "SR" might be more desirable than "SRC" because "SR" allows the indicator 136 to be a square and take up less space on the substrate. In addition, any other suitable letter, letter combination, symbol, the like, or combination of the above, can be used as the function indicator 138. In one embodiment, the function indicator is formed in the design layout, on the implant mask and the gate electrode mask, and is formed on the wafer as an implant and during the gate electrode formation. Thus, the function indicator 138 may be the same material as the gate electrode, which may be polysilicon, a metal, the like, or combinations of the above. Although the implanted regions of the first direction indicator 136 and the function indicator 138 may be not be easily detected visually by the naked eye of a human, they can be detected by other means, such as using a microscope (e.g., SEM (scanning electron microscope)).

As previously discussed, the second direction indicator 140 can be used to check for design rule violations; any suitable methods can be employed to do so. In one embodiment, one side edge of the second direction indicator 140 is expanded a first predetermined distance, which in one embodiment is equal to the distance from the expanded edge of the second direction indicator 140 and the most distant edge of the first direction indicator 136. After the expansion, the area covered by the first direction indicator 136, the function indicator 138, and the expanded second direction indicator 140 is measured. Only when the area meets a predetermined value, which occurs when the second direction indicator 140 is expanded so that it covers the first direction indicator 136 and the function indicator 138, is the design rule not violated. To use this approach, the shapes function indicator 138 and the second direction indicator 140 should be in the same mask layer so that when the correct edge of the second direction indicator 140 is expanded by the required distance, it covers all of the function indicator 138 and the total area is then determined by the expanded shape. This approach enables the direction of the indicator to be determined when checking the design rule. Any conventional or suitable software for design rule checking can be used. For example, the following design rule checking software may be used: Assura™ sold by Cadence Systems headquartered in San Jose, Calif.; Calibre® sold by Mentor Graphics® headquartered in Wilsonville, Oreg.; or Hercules™ sold by Synopsys® headquartered in Mountainview, Calif.

In one embodiment, the second direction indicator 140 is formed in the design layout, on the gate electrode mask, and on the wafer during gate electrode formation. Thus, the second direction indicator 140 may be the same material as the gate electrode. If the function indicator 138 and the second direction indicator 140 are formed of the same material as the gate electrode, these indicators can easily be detected, for example visually by an operator in the manufacturing facility. In one embodiment, the second direction indicator 140 is formed only on the mask.

The indicators in FIG. 4 are not aligned appropriately because the function indicators 138 or the first direction indicators 140 do not face the same direction for each IP block 52, 90, 110, and 100. Thus, at least one of the IP blocks 52, 90, 110, and 100 need to be rotated until all of function indicators 138 face the same direction or all of the first direction indicators 140 face the same direction.

Figure 5:
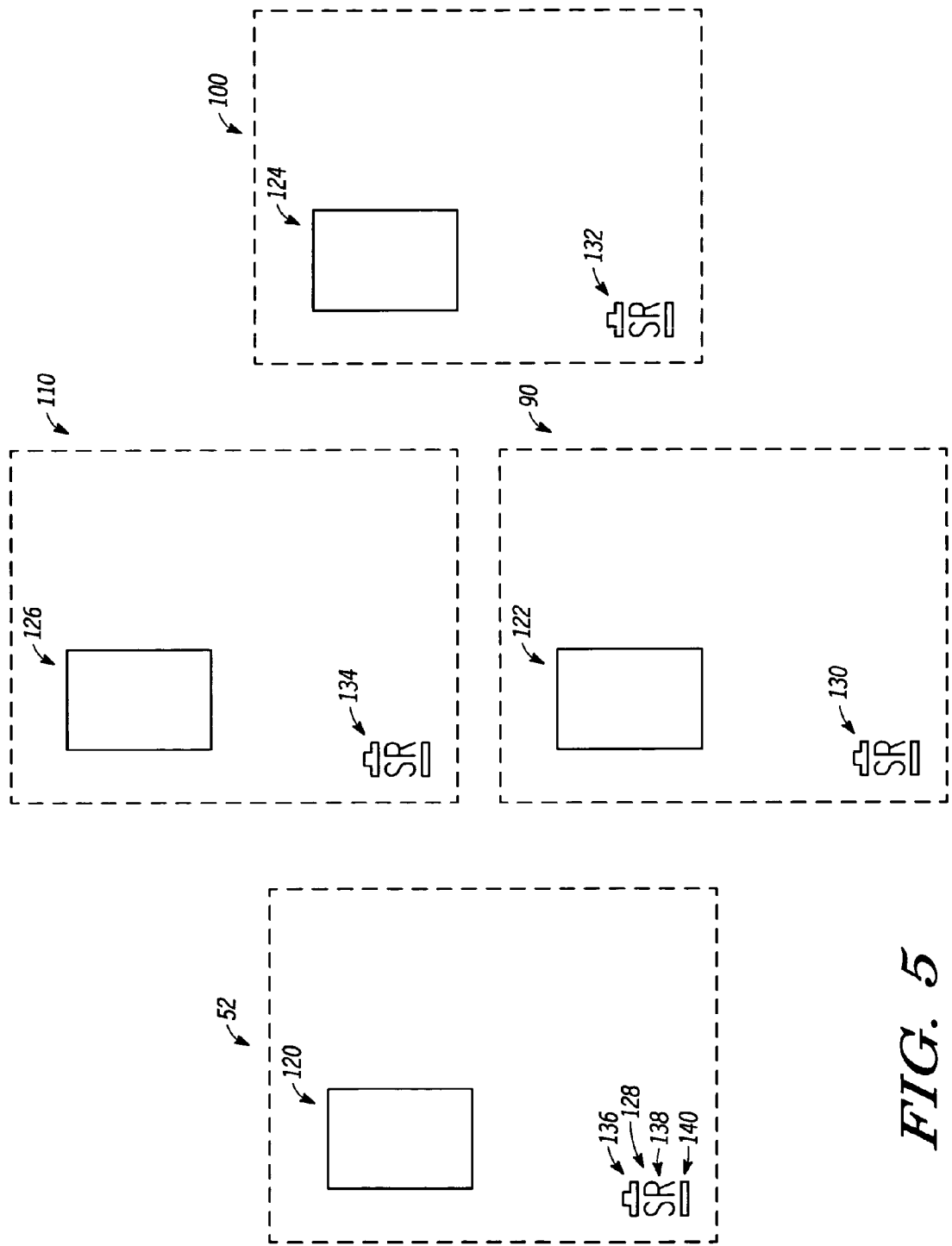
FIG. 5 illustrates a modified mask layout of FIG. 3 with indicators in accordance with an embodiment of the present invention showing a desirable layout.

In FIG. 5, the indicators are aligned appropriately so that the implants will occur in the correct direction for each device having the same direction (e.g., all devices with direction A, etc.). Because the indicators are aligned properly, the IP blocks 52, 90, 100, and 110 and the openings 120, 122, 124, and 136 are aligned properly: The indicators are aligned properly because all of the function indicators 138 and the first direction indicators 140 are oriented in the same direction for each IP blocks 52, 90, 100, and 110. When the indicators are aligned properly, the devices with different directions (e.g., directions A, B, C, and D) may or may not be rotated relative to each other, but each device with the same direction (e.g., all devices with direction A or all devices with direction B etc.) is not rotated relative to the other devices with the same direction (e.g., devices 53, 92, 102 and 112 are not rotated relative to each other).

FIGS. 6-8 illustrate some examples of other indicators that may be used. However, any suitable indicator may be used that includes a function indicator 138 and a first direction indicator 136, or a second direction indicator 140, or both. In some embodiments, the different types of indicators (e.g., the first direction indicator 136 and the second direction indicator 140) may be the same as another type of indicator or the overall indicator or one may be a portion of the another type of indicator or the overall indicator. In addition, there may be more than one possible feature of the indicator that can serve as one of the different types of indicators (e.g., the second direction indicator). For example, the indicator shown in FIG. 5 includes two possible second direction indicators and the first direction indicator 136 is the same as the function indicator 138. The indicator shown in FIG. 6 is a hat just like the first indicator 136 shown in FIG. 4. Thus, the indicator shown in FIG. 6 can be a stand alone indicator or be combined with other indicators. Similarly, the bottom of the hat (e.g., the longest straight edge of the hat) could be the second function indicator 138 because it need not be an entire shape and can be an edge of a shape, for example. Indicators that are symmetric in one direction, such as those shown in FIGS. 6 and 8, are useful for detecting rotation. Indicators, such the indicator shown in FIG. 7, are asymmetric in all directions and are useful for indicating both rotation and flipping of device layouts.

FIG. 7 illustrates another example of a possible indicator, which is a hand with a finger pointing in one direction and a thumb 150 in another direction. The entire indicator may be the function indicator 138. Thus, the entire hand (with the gesture shown or another gesture) may be used to denote the direction of an asymmetrical implant. If the hand has the gesture shown in FIG. 6, the pointing finger may be the first indicator 136. It may be desirable to omit the thumb because the thumb includes approximately 45 degree angles, which are difficult to form accurately on a wafer. The cuff (or a portion (e.g., an edge) thereof) may be used as the second direction indicator 140 or a square on the cuff (or a portion thereof), which could denote a cuff link or button, may also be used as a second direction indicator, if present.

FIG. 8 illustrates yet another example of a possible indicator, which is an arrow. The arrow shown has approximately 45 degree angles and therefore, might be undesirable. An arrow without 45 degree angles may be used instead, if desired. The entire indicator illustrated in FIG. 8 may be the function indicator 138 and the top triangular portion may be the first indicator 136. The bottom rectangular portion (or a portion thereof) may be used as the second direction indicator 140.

Although the indicators shown in the figures are perpendicular to the bottom of the paper (or at least are at multiples of 90 or 0 degrees relative to the page), the indicators can be titled. For example, the arrow in FIG. 8 could be titled by any degree, such as 17 degrees. However, this is not desirable since it would take up additional space on the wafer when formed and may be more difficult to form as the edges of the indicator may be on an angle.

FIG. 9 illustrates a flow chart for implementing indicators, such as those shown in the figures, in integrated circuit manufacturing. The flow starts at 300 and a layout direction is chosen and one or more direction indicators are placed in step 302. Next, IP blocks, such as those shown in FIGS. 2-4 (e.g., IP blocks 52, 90, 100, and 110) are combined in a design layout in step 304. After combining the IP blocks, the design rule checking of the design layout begins in step 306. During the design rule checking, which can be performed with any suitable software as previously discussed, the orientation indicator(s) are examined to see if they all indicate a same direction in decision diamond 308. In one embodiment, the orientation of the indicator(s) are examined to see if they are pointing in the correct direction. As previously discussed, this can be determined using any suitable methods, such as expanding the second direction indicator 140 and determining the area of the expanding second direction indicator 140 and the entire indicator itself. If the area equals a predetermined area then indicator is pointing in the correct direction. If all the areas are equal for each indicator then the indicators are all indicating the same direction. If the answer to the decision diamond 308 is no then at least one IP block is rotated in step 310 and the decision diamond 308 is repeated to see if the orientation indicator(s) all indicate a same direction. Once the orientation indicator(s) all indicate the same direction, the design rule checking of the design layout is completed in step 312. Although not discussed, other decisions and steps may be performed during the design rule checking.

After completing the design rule checking, mask floorplanning is begun in step 314. During mask floorplanning, a reticle field is formed using a plurality of design layouts and scribe grids in step 316. Scribe grids are placed between the plurality of design layouts, because each design layout will be a die. After forming the reticle field, it is determined if the orientation indicator(s) for the plurality of design layouts and scribe grids indicate a same direction as described in decision diamond 318. In one embodiment, the orientation is determined by examining the second direction indicator 140 using any suitable method, such as that described in regards to design rule checking.

If the orientation indicators do not indicate the same orientation then at least one of the plurality of design rule layouts or scribe grids is rotated in step 320. Next, the decision diamond 318 is repeated to determine if the orientation indicator(s) for the plurality of design layouts and scribe grids indicate the same direction.

Once the orientation indicators indicate the same orientation then mask floorplanning in completed in step 322. One skilled it the art recognizes that although not described additional steps may be performed during mask floorplanning.

After completing mask floorplanning a mask is made using the mask floorplanning in step 324 using conventional processing. Once the mask is made, IC (integrated circuit) manufacturing is begun to form ICs in step 326. During IC manufacturing the implant direction based on directionality of orientation indicators is determined in step 328. In one embodiment, the first direction indicator 136 is used. Next, in step 330 an implant is performed using the implant direction as determined by the orientation indicators. Afterwards, IC manufacturing is completed to form ICs in step 332. A skilled artisan recognizes that additional steps that are known to a skilled artisan are performed after and before steps 328 and 330 may be performed to form ICs. After forming the ICs, they are separated in step 334 and then the process ends 336.

In a preferred embodiment, the indicator is used to denote an asymmetric implant. However, the indicator can be used for other functions, if desired, such as denoting the crystal lattice orientation of the substrate. Sometimes a dual orientation substrate is used. For example, the substrate may have a semiconductor material with a <110> lattice in one area that is useful for P channel devices and a semiconductor material with a <100> lattice in another are that is useful for N channel devices. In this embodiment, the indicator may be formed on the mask used to pattern the active layer. Furthermore, any indicator discussed above could be used. However, a modification to the indicator shown in FIG. 4 may be desirable such as replacing the "SR" with "DS," "SO," "SB," or any other letters or symbol that may be desirable to indicate dual substrate orientation (DSO).

By now it should be appreciated that there has been provided a method for using an indicator in an integrated circuit manufacturing process. A visually discernable indicator, which may be formed as part of an integrated circuit, is described. The visually discernable indicator indicates directionality of a non-visually discernable characteristic of the integrated circuit, such as indicating direction of an implant from a visual inspection, crystal lattice orientation, the like, and combinations of the above. Thus, in one embodiment, a directionally dependent process, such as a tilt angle implant, is performed using the first indicator to determine the directionality of the non-visually discernable characteristic. In one embodiment, the indicator is used to discern the non-visually discernable characteristic during manufacturing of the integrated circuit. In one embodiment, the visually discernable indicator includes a first portion used during design of the integrated circuit and a second portion used during manufacture of the integrated circuit. The first portion may be used during design rule verification. The second portion may include a function indicator and a direction indicator.

The indicator(s) can be present in the IP blocks as shown in FIG. 4 or can also be put anywhere else in the design layout, the mask, or on the wafer, such as in the scribe lines. The indicator can be recognizable visually and by physical verification by an operator with the naked eye. The indicator includes orientation information and appears on the wafer and the mask. In addition, the indicator may be viewable in a single layer. The indicator may be used in the design rule check. Furthermore, the indicator may be understood easily by a worker in the manufacturing environment, such as an operator or technician. In addition, the indicator improves cycle time and decreases complexity by avoiding the need to check each step in the design date flow between the design layout and mask.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. For example, any suitable indicator can be used; the indicators are not limited to the embodiments shown in the figures.

Accordingly, the specification and figures are to be regarded in an illustrative rather than a restrictive sense, and all such modifications are intended to be included within the scope of the present invention.

Although the invention has been described with respect to specific conductivity types or polarity of potentials, skilled artisans appreciated that conductivity types and polarities of potentials may be reversed.

Moreover, the terms "front", "back", "top", "bottom", "over", "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one.

The term "plurality", as used herein, is defined as two or more than two. The term another, as used herein, is defined as at least a second or more.

The term "coupled", as used herein, is defined as connected, although not necessarily directly, and not necessarily mechanically.

What is claimed is:

1. A method for indicating directionality in integrated circuit manufacturing, the method comprising:
    forming a first indicator within a first block of the integrated circuit to indicate a directionality of a non-visually discernable characteristic of the first block; and
    performing a directionally dependent process using the first indicator to determine the directionality of the non-visually discernable characteristic of the first block.

2. A method as in claim 1, wherein the directionally dependent process comprises an implant.

3. A method as in claim 2, wherein the implant comprises a halo implant.

4. A method as in claim 3, wherein the halo implant comprises a halo implant for a source region.

5. A method as in claim 1, wherein the first indicator indicates a crystal lattice orientation.

6. A method as in claim 1, further comprising:
    forming a second indicator within a second block of the integrated circuit to indicate a directionality of the non-visually discernable characteristic of the second block;
    determining if the first indicator and the second indicator indicate a same directionality; and
    if the first indicator and the second indicator do not indicate the same directionality, rotating the second at least one block of the integrated circuit.

7. A method as in claim 6, wherein said rotating the second block of the integrated circuit is performed during design rule checking for the integrated circuit.

8. A method as in claim 6, wherein said rotating the second block of the integrated circuit is performed during mask floor-planning for the integrated circuit.

* * * * *